(12) United States Patent
Dao et al.

(10) Patent No.: US 8,813,005 B1
(45) Date of Patent: Aug. 19, 2014

(54) DEBUGGING USING TAGGED FLIP-FLOPS

(71) Applicant: Xilinx, Inc., San Jose, CA (US)

(72) Inventors: Khang K. Dao, San Jose, CA (US);
Kyle Corbett, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/016,941

(22) Filed: Sep. 3, 2013

(51) Int. Cl.
*G06F 17/50* (2006.01)

(52) U.S. Cl.
USPC .......................... 716/102; 716/107; 716/136

(58) Field of Classification Search
USPC .......................................... 716/102, 107, 136
See application file for complete search history.

(56) References Cited

U.S. PATENT DOCUMENTS

| | | | | |
|---|---|---|---|---|
| 5,828,825 A | * | 10/1998 | Eskandari et al. | 714/27 |
| 5,974,248 A | * | 10/1999 | Graef | 703/22 |
| 6,968,520 B2 | * | 11/2005 | Kawabe et al. | 716/106 |
| 7,089,135 B2 | * | 8/2006 | Rajsuman et al. | 702/117 |
| 7,448,008 B2 | * | 11/2008 | Seigler et al. | 716/106 |
| 8,281,279 B2 | * | 10/2012 | Maloney et al. | 716/136 |
| 2006/0026548 A1 | * | 2/2006 | Roesner et al. | 716/18 |
| 2006/0291295 A1 | * | 12/2006 | Connally et al. | 365/189.01 |

OTHER PUBLICATIONS

Specification and drawings for U.S. Appl. No. 13/946,137, filed Jul. 19, 2013, Donlin et al.

* cited by examiner

*Primary Examiner* — Jack Chiang
*Assistant Examiner* — Brandon Bowers
(74) *Attorney, Agent, or Firm* — LeRoy D. Maunu

(57) ABSTRACT

Approaches for testing a module of a circuit design include tagging flip-flops in a netlist of the module with respective path names of the flip-flops from a hardware description language specification of the module. In simulating with the netlist, event data are captured to a first file. A process determines whether or not event data in the first file matches event data in a second file of event data. In response to a difference determined between the first file and the second file, an earliest occurrence of an event in the first file having an associated signal value of a first signal that does not match an associated signal value of a corresponding event in the second file is determined. The one of the plurality of flip-flops that output the first signal is determined, and the respective path name of the one flip-flop is output.

19 Claims, 8 Drawing Sheets ional a module of a circuit design.

DEBUGGING USING TAGGED FLIP-FLOPS

TECHNICAL FIELD

The disclosure generally relates to testing a module of a circuit design.

BACKGROUND

Modern integrated circuits (ICs) are developed through the use of hardware description languages (HDLs). HDLs such as VERILOG, VHDL, and the like allow developers to create software-based representations of circuit designs. One advantage of using an HDL is the potential for code reuse from one design to another. This concept has been realized with the commercial availability of intellectual property (IP) cores.

In general, an IP core (hereinafter core or module) refers to a software representation of a semiconductor component that provides a processing function. Different varieties of cores exist. For example, some cores can provide basic functions. These cores can be included in a circuit design or, alternatively, can be used as subcomponents within a larger, more complex core. Another variety of cores can function as a logic bridge to software-based bus objects such as Peripheral Component Interconnect (PCI) and/or Advanced Microcontroller Bus Architecture (AMBA) busses.

Some cores are highly configurable and prior to release undergo extensive testing to verify whether or not the core is functionally correct. A common approach to verification of a core is with a testbench. A testbench, also referred to as a verification environment, provides test stimuli and verifies the behavior of a design under test, in this case one or more cores. Generating a testbench involves describing the connections, events, and test vectors for different combinations of transactions involving the core(s). A testbench also refers to the code used to create a pre-determined input sequence to the cores, as well as the code responsible for observing the response.

A core may undergo a number of transformations in the process of incorporating the core into a larger design and implementing the final product. Initially, the core may be customized according to the requirements of the target application. For example, the core may be customized in terms of data width, data rate, etc. The customization of an IP core may be governed by a specific set of parameters and rules that define how the parameters are translated into values for the core's HDL parameters. In later stages, the core may be synthesized, and the resulting netlist optimized, placed and routed.

At each stage it would be desirable to verify that no errors have been introduced into the core. If an error is discovered only after the circuit has been implemented, identifying the source of and fixing the error may be extremely expensive and time consuming. Though correcting an error early in the design process rather than later in the design process may be less costly, debugging the design or electronic design automation (EDA) tool to find the source of the error may be a manual process and time intensive.

SUMMARY

In one embodiment, a method of testing a module of a circuit design is provided. The method includes tagging a plurality of flip-flops in a netlist of the module with respective path names of the flip-flops from a hardware description language (HDL) specification of the module. Simulation with the netlist is performed on a programmed processor, and event data is captured to a first file during the simulation. For each event of the simulation, the event data describes a signal identifier, an associated signal value, and an associated timestamp. The method determines whether or not event data in the first file matches event data in a second file of event data. In response to a difference determined between the first file and the second file, the method determines an earliest occurrence of an event in the first file having an associated signal value of a first signal that does not match an associated signal value of a corresponding event in the second file. The one of the plurality of flip-flops that output the first signal is then determined. The method then outputs the respective path name of the one flip-flop.

In another embodiment, a system for testing a module of a circuit design is provided. The system includes a processor and a memory arrangement coupled to the processor. The memory arrangement is configured with program code, and the program code when executed by the processor, causes the processor to perform operations including tagging a plurality of flip-flops in a netlist of the module with respective path names of the flip-flops from a hardware description language (HDL) specification of the module. Simulation with the netlist is performed on the processor, and event data is captured to a first file during the simulation. For each event of the simulation, the event data describes a signal identifier, an associated signal value, and an associated timestamp. The system determines whether or not event data in the first file matches event data in a second file of event data. In response to a difference determined between the first file and the second file, the system determines an earliest occurrence of an event in the first file having an associated signal value of a first signal that does not match an associated signal value of a corresponding event in the second file. The one of the plurality of flip-flops that output the first signal is then determined. The system then outputs the respective path name of the one flip-flop.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION

This disclosure describes approaches for automating the debugging process to isolate the source of a failure in either a design or an EDA tool. An error may be discovered in an observed difference between a simulation of the source code of the design and simulation of a netlist or another version of the design. The approaches will benefit a designer who may be familiar with the underlying HDL code and EDA developers who may benefit from a methodical and scriptable approach to reduce the time needed to identify and fix a problem.

Various approaches are disclosed for debugging using tagged flip-flops. In one approach, flip-flops in a netlist of a module of a circuit design are tagged with the respective path names of the flip-flops from the source hardware description language (HDL) specification of that design module. For purposes of the current discussion, the term flip-flop is used to refer to any clocked, bi-stable device.

Once the flip-flops in the netlist have been tagged with the HDL path names, the netlist is simulated, and event data is captured to a first file. For each event, the event data describes a signal identifier, an associated signal value, and an associated timestamp. The first file is compared to a second file containing expected event data to determine whether or not an error occurred during the simulation. If there is a difference between the two files, the earliest occurrence of an event in the first file having an associated signal value of a first signal that does not match an associated signal value of a corresponding event in the second file is determined. From the earliest determined signal, the flip-flop that output the signal is determined, and the HDL path name tagged to that flip-flop is output.

The tags associated with the flip-flops are preserved as the HDL and netlist are further processed. This allows the debugging approach to be used in subsequent implementation stages.

Figure 1:
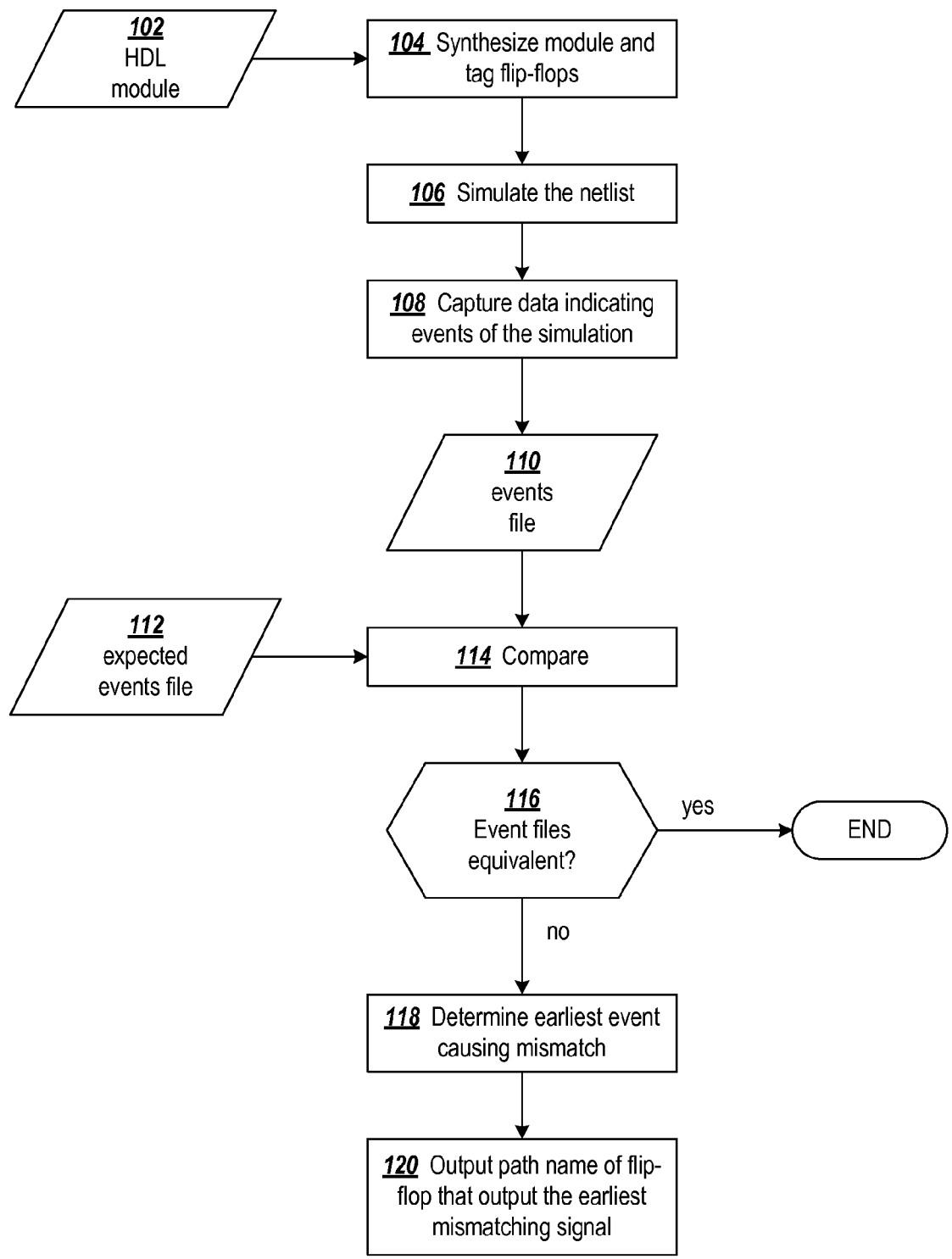
FIG. 1 is a flowchart of a process for testing a module of a circuit design using tagged flip-flops in a netlist.

FIG. 1 is a flowchart of a process for testing a module of a circuit design using tagged flip-flops in a netlist. An HDL module 102 is synthesized at block 104 and the flip-flops in the resulting netlist are tagged with respective path names derived from the HDL specification. It will be recognized that current synthesis tools provide the capability to tag flip-flops with HDL path names. Each path name includes a list of one or more labels of hierarchical elements from the HDL specification. The list identifies the location in the HDL specification to which the flip-flop can be traced using the labels in the list. For example, the path name may include the flip-flop name, along with the entity/architecture, package, configuration, module, and/or process, etc. in which the flip-flop is defined to generate a signal in the netlist. An example path name may be testbench.top.inst1.inst2.datapath_reg[0]. Proceeding from left to right in the path name, the element names are from the highest level in the hierarchy to the lowest level in the hierarchy, and each element name in the hierarchy is separated by a period.

Figure 3:
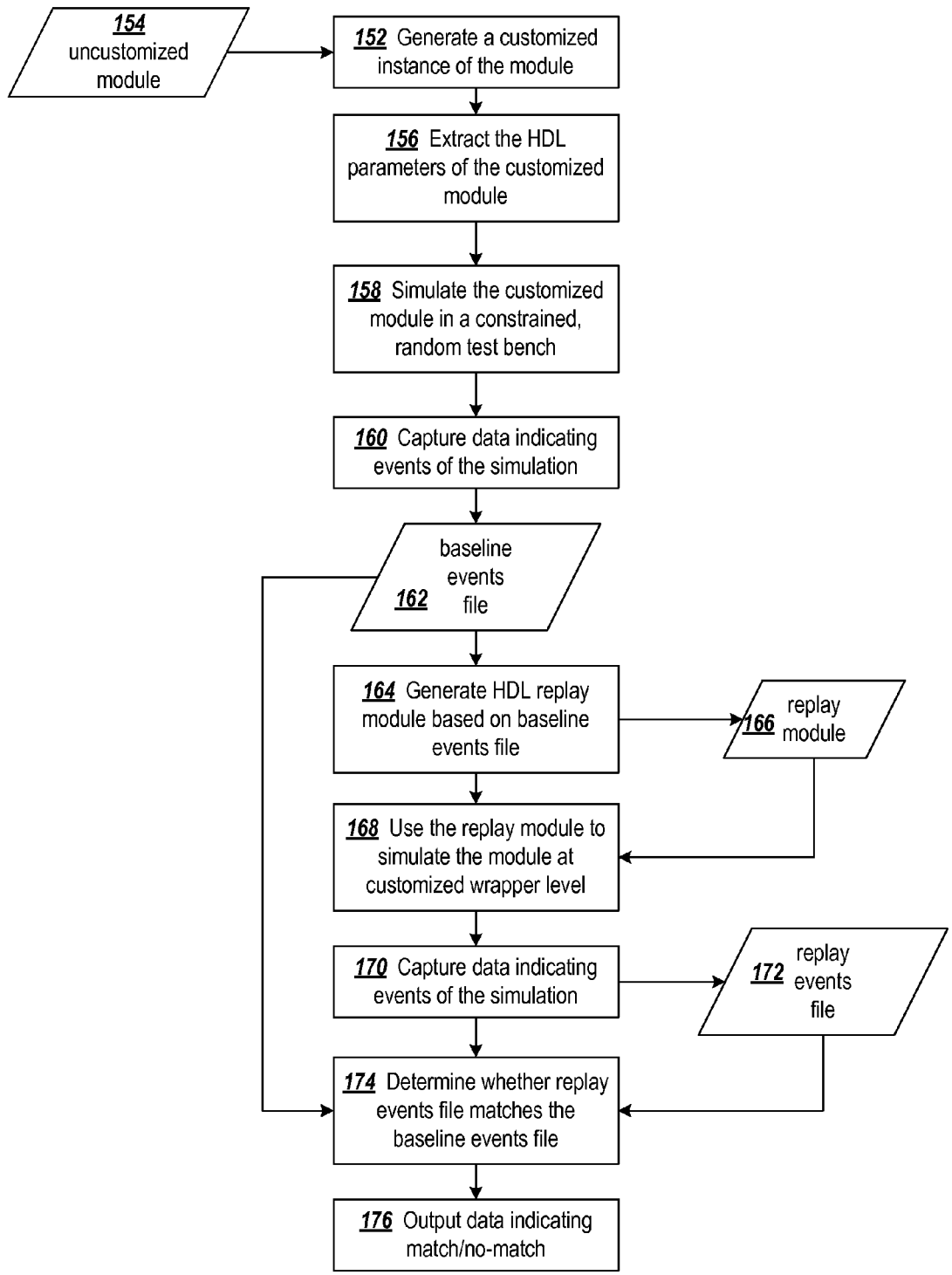
FIG. 3 is a flowchart of a process for verification of a module using a replay module.

At block 106, the netlist is simulated, and at block 108 the simulation results are captured as event data in an events file 110. Block 114 compares the events file 110 to an expected events file 112. In an example implementation, the expected events file 112 was generated from previously simulating the HDL module 102. Further description of the expected events file, which is also referred to as the baseline events file, is shown in FIG. 3.

In comparing the two events files 110 and 112, the process determines whether or not the files are equivalent. That is, the process determines whether or not each event in the events file 110 has a corresponding event in the expected events file 112 with an equal signal value and the same relative time of occurrence. FIGS. 6, 7, 8, and 9 show approaches for determining whether or not events have the same time of occurrence. It will be recognized that the process may be applied to further transformations of the HDL module or netlist into a modified design module. For example, the described process may be used in simulating a netlist that has undergone power optimization, debug/test circuit insertion, or conversion to another language or technology (e.g., converted to C program or spice model or transistor based netlist, etc).

If the events files are equivalent, the process is complete at block 116. Otherwise, at block 118, the process determines the earliest event in the events file 110 not having a matching event in the expected events file 112. In other words, the process determines the event in the events file 110 that has the earliest timestamp and for which the signal value does not match a corresponding event in the expected events file 112.

By referencing the netlist, the signal identifier from the earliest non-matching event is used to determine which flip-flop output the signal. At block 120, the path name tagged to the identified flip-flop is output. The output may be to a display device or to a data storage device, for example.

Figure 2:
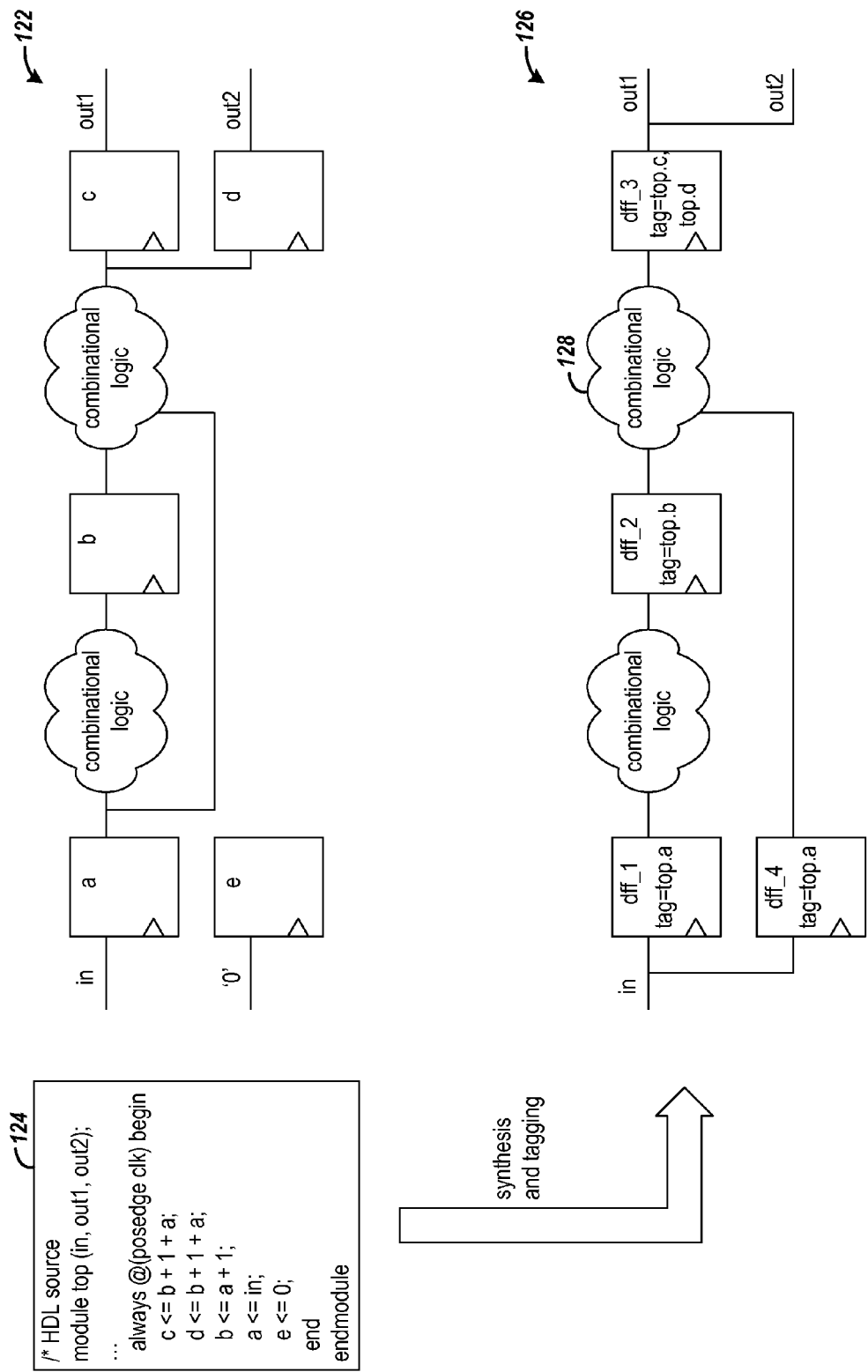
FIG. 2 shows example HDL source code, a schematic based on the HDL source code, and a schematic based on the netlist resulting from synthesis and tagging of the HDL source code.

FIG. 2 shows example HDL source code, a schematic based on the HDL source code, and a schematic based on the netlist resulting from synthesis and tagging of the HDL source code. Schematic 122 corresponds to HDL source code segment 124, and schematic 126 is a representation of the post-synthesis and tagged netlist resulting from HDL source code segment 124.

Flip-flop a in schematic 122 is renamed dff_1 in the netlist schematic 126. Flip-flop b in schematic 122 is renamed dff_2 in the netlist schematic 126. Flip-flops c and d in schematic 122 have been combined into the flip-flop dff_3 in the netlist schematic 126. A flip-flop named dff_4 is added to schematic 126 to receive the input in and provide the signal to combinational logic 128. The flip-flop dff_4 may have been added to satisfy timing constraints, for example. No flip-flop is instantiated in schematic 126 to correspond to flip-flop e in schematic 122 since the output of flip-flop e is not connected to any logic in schematic 122.

Tags have been assigned to flip-flops dff_1, dff_2, dff_3, and dff_4 as shown in the netlist schematic 126. Flip-flops dff_1 and dff_4 have been tagged with the path name top.a since both flip-flops are traceable to flip-flop a in the HDL schematic 122 and HDL source code segment 124. Flip-flop dff_2 is tagged with the path name top.b, and flip-flop dff_3 is tagged with the path name top.c,top.d.

Flip-flops c and d in the HDL schematic 122 are combined into a single flip-flop in the netlist schematic 126 since the flip-flops c and d input the same value. The combining of the flip-flops is tracked by tagging flip-flop dff_3 with the path names of both flip-flop c and d.

In some HDLs, synthesis may convert a combination of elements, one of which is a flip-flop, into a different, non-flip-flop netlist element, such as a shift register, a digital signal processing (DSP) element, a random access memory (RAM) cell, or other element on the target device. In such a conversion, the netlist element is tagged with the path name of a flip-flop that provides the signal to the output port of the element.

FIG. 3 is a flowchart of a process for verification of a module using a replay module. Block 152 generates a customized instance of an uncustomized module 154. The uncustomized module may be a core selected by a designer and customized for use as a component in a larger circuit design. The customized instance may include values of parameters as specified by the designer.

Some tools isolate the designer from the details of the hardware description language (HDL) implementation of the cores that are available for use in a circuit design. Such tools may further support the customization of the parameter values in a manner that hides the actual HDL parameter values of the underlying core. At block 156, the values of those HDL parameters are extracted from the customized module, and the extracted HDL parameter values are used to create an HDL wrapper around the module.

At block 158, the customized HDL module (with the wrapper) is simulated in a constrained, random testbench. The simulation input may be constrained to ranges or distributions of values, and the values may be generated pseudo-randomly subject to the constraints. The results of the simulation are captured at block 160 and stored as events in a baseline events file 162. In an example implementation, the baseline events file may be a value change dump (VCD) file as recognized by those skilled in the art. A VCD file is in an ASCII-based format and includes a series of time-ordered value changes for the signals in a given simulation model. The VCD includes a sequence of timestamps and with each timestamp the signals whose values change are listed (e.g., value/id pair).

At block 164, an HDL replay module 166 is generated from the baseline events file. The HDL replay module contains a module declaration with output ports declared according to the ports of the module that should be driven during the test. The time-ordered port transition events from the baseline events file are re-created by writing the appropriate HDL statements into the body of the code block in the HDL replay module. The proper timing of the events is retained by inserting delay statements into the body of the HDL replay module. Though the replay module may become large, it is relatively simple to compile and inexpensive to execute during simulation.

Selection of the subset of data from the baseline results file for translation into the replay module is made based on the information carried in the header of the baseline results file. In the header, the port names, dimensions, and signal directions are declared. This information indicates those data items in the baseline results file to be added to the replay module as port assignments and delays. Example 1 shows an example of a baseline results file.

```
$scope module testbench $end
$scope module DUT $end
$var port 1 <0 aclk $end
$var port 1 <1 aresetn $end
$var port 1 <2 aclken $end
$var port 1 <3 s_axis_tvalid $end
$var port 1 <4 s_axis_tready $end
$var port [23:0] <5 s_axis_tdata $end
$var port [2:0] <6 s_axis_tstrb $end
$var port [2:0] <7 s_axis_tkeep $end
$var port 1 <8 s_axis_tlast $end
$upscope $end
$upscope $end
$enddefinitions $end
#0
$dumpports
pX 6 6 <4
pZ 0 0 <3
pZ 0 0 <8
```

Example 1

The correctness of the replay module may be verified, beginning at block 168. At block 168, the module under test (with the wrapper) is simulated using the replay module to drive input signals. At block 170, the simulation data is captured and stored as a VCD replay events file 172.

Block 174 determines whether or not the replay events file matches the baseline events file, and block 176 outputs data indicating whether the files match or do not match. Matching files indicates that the replay module is an accurate recreation of the base set of stimuli (from block 158), which were known to indicate proper functioning of the module.

The replay module offers several benefits. Since the replay module provides an accurate recreation of a set of randomized stimuli for which the module under test was known to pass, the replay module may be used at various stages of the implementation process. Also, since the replay module contains relatively primitive HDL statements it is easily compiled and efficient to run in simulators that do not support advanced testbench language constructs. Also, license fees may be saved because special simulators are not required to simulate the module with advanced testbench languages.

Figure 4:
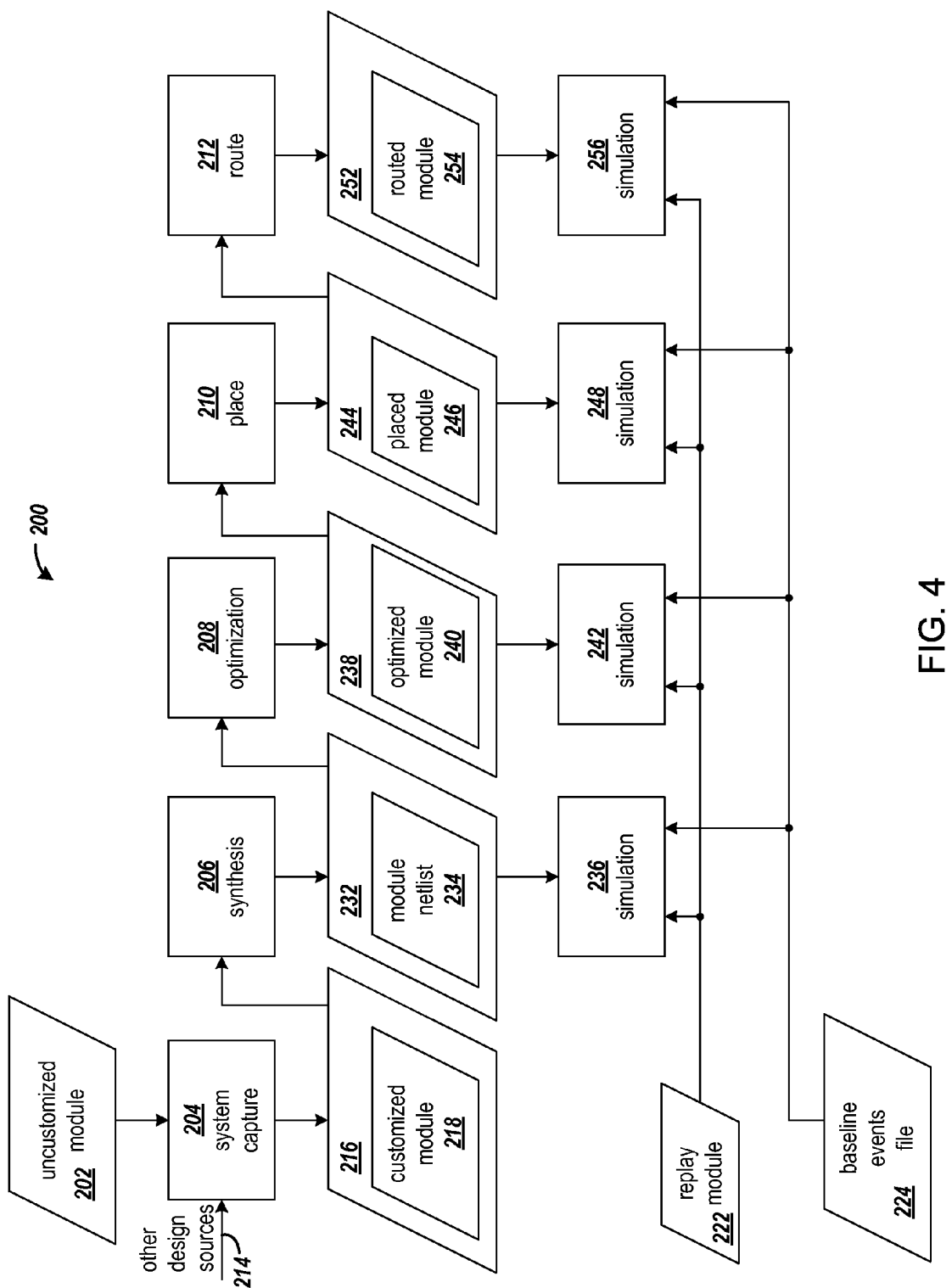
FIG. 4 is a dataflow diagram that shows use of the replay module in verification of a module in multiple stages of a design process 200.

FIG. 4 is a dataflow diagram that shows use of the replay module in verification of a module in multiple stages of a design process 200. The stages of the design process generally include system capture tool 204, synthesis stage 206, optimization stage 208, place stage 210, and route 212, as would be recognized by those skilled in the art. An uncustomized module 202 is input to a system capture tool 204. A designer operating a system capture tool can create a circuit design 216 by customizing the uncustomized module and using other design sources 214. Such other design sources include other cores and objects from a library of circuit design resources. Along with other design objects (not shown), the circuit design 216 includes customized module 218, which has designer-provided parameter values applied to the uncustomized module 202. Using the process described in FIG. 1, the baseline events file 224 may be generated by simulating the customized module 218 and the replay module 222, which was previously generated from the baseline events file.

The circuit design 216 and customized module 218 are synthesized in synthesis stage 206. The synthesized design 232 includes module netlist 234, which is the synthesized version of the customized module 218. The synthesized design and module netlist are input to a netlist simulation 236. The netlist simulation 236 performs the process shown in FIG. 3.

Figure 5:
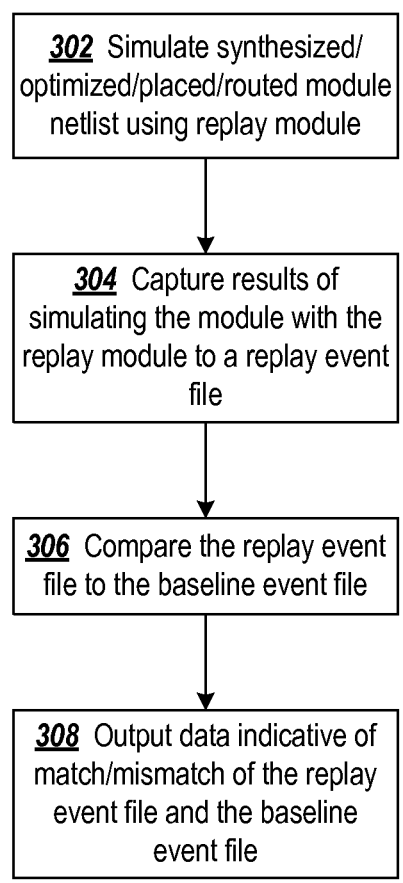
FIG. 5 is a flowchart of a process for simulating a module under test using a replay module and verifying whether or not simulation of the module under test produced correct results.

FIG. 5 is a flowchart of a process for simulating a module under test using a replay module and verifying whether or not simulation of the module under test produced correct results. The same general process of FIG. 3 is performed in each of the simulations 236, 242, 248, and 256 shown in FIG. 2, and the flowchart of FIG. 3 symbolizes the processing in each of those simulations.

At block 302, the module is simulated using the replay module. Depending on which of the simulations 236, 242, 248, and 256 is being performed, the module that is simulated is one of the modules having been synthesized, optimized, placed, or routed. The results of the simulation are captured to a replay event file at block 304. The replay event file may be a VCD file as described above.

The replay event file is compared to the baseline event file at block 306 to determine whether or not the results of the simulation in the current implementation phase (synthesis, optimization, place, or route) match the results of simulating the customized module (FIG. 1, block 108). At block 308, the process outputs data that indicates whether or not the replay events file matched the baseline events file.

Returning now to FIG. 4, following the synthesis stage 206, the circuit design may be submitted to optimization stage 208 for optimization. The result of optimization is an optimized netlist 238, which includes the optimized module 240. Optimized module 240 is an optimized netlist of the module under test. The simulation 242 simulates the optimized module 240 using the replay module 222 and determines whether or not the optimized module simulated correctly by comparing the generated replay events file to the baseline events file 224, as described in FIG. 3.

Following optimization, the circuit design may be submitted to place stage 210 for placing the optimized netlist. A placed circuit design 244 is generated, and the placed circuit design includes placed module 246, which is a placed netlist version of the module under test. The simulation 248 simulates the placed module 246 using the replay module 222 and determines whether or not the placed module simulated correctly by comparing the generated replay events file to the baseline events file 224, as described in FIG. 3.

Following placement, the circuit design may be submitted to route 212 for routing the placed netlist. A routed circuit design 252 is generated, and the routed circuit design includes routed module 254, which is a routed netlist version of the module under test. The simulation 256 simulates the routed module 254 using the replay module 222 and determines whether or not the routed module simulated correctly by comparing the generated replay events file to the baseline events file 224, as described in FIG. 3.

Figure 6:
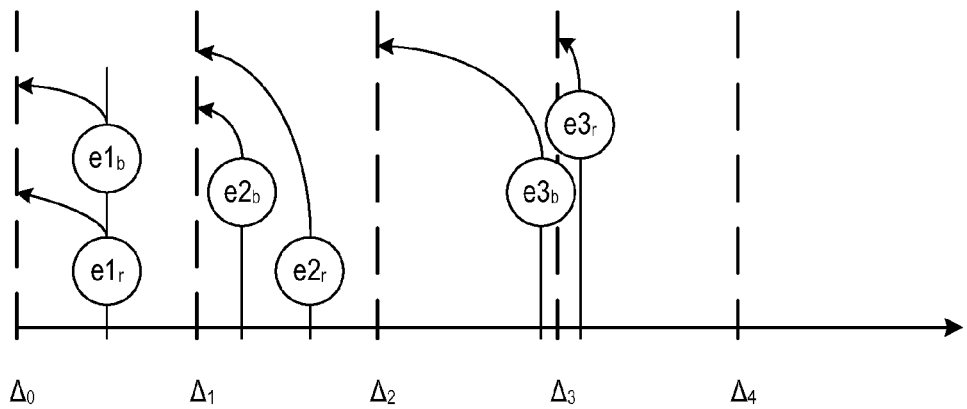
FIG. 6 is a timing diagram that shows how quantization times are used to determine whether events described in the baseline events file match corresponding events described in the replay events file.
Figure 7:
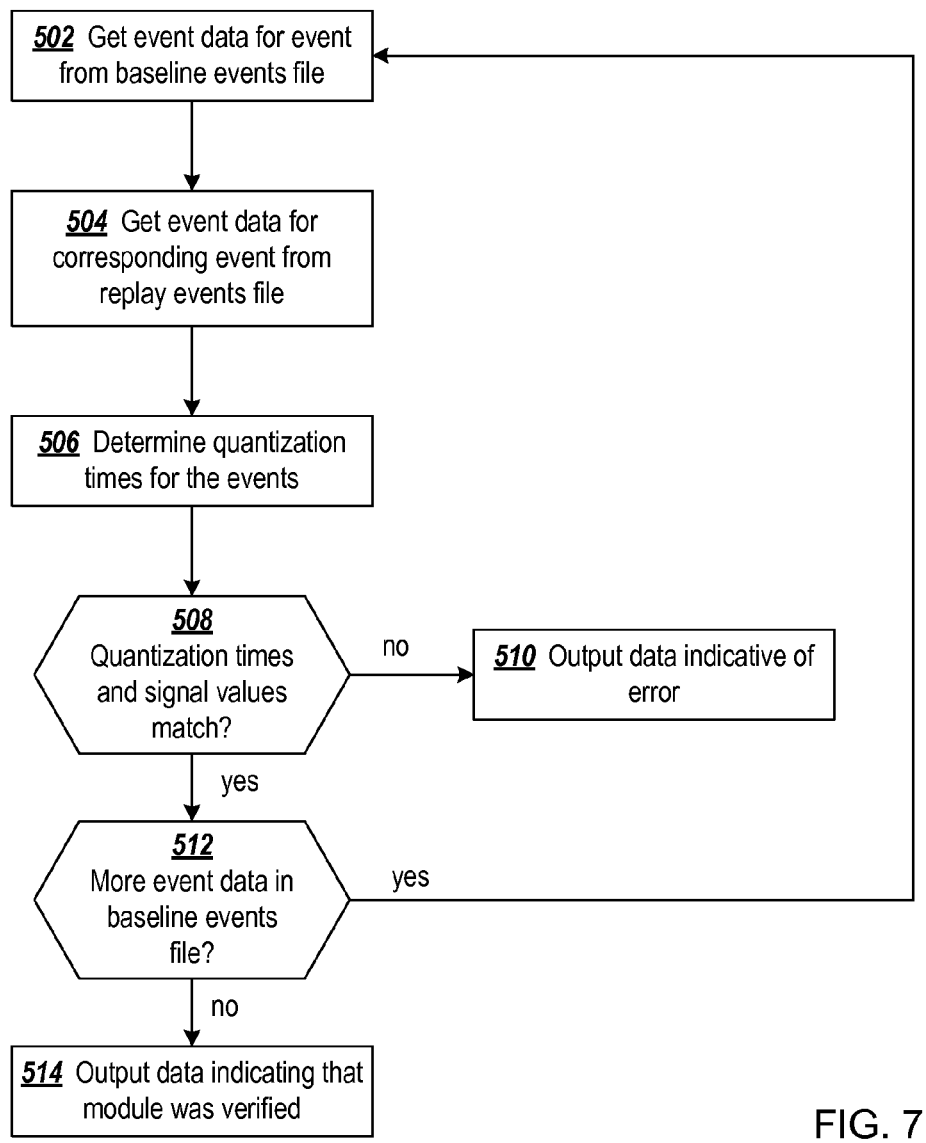
FIG. 7 is a flowchart of a process in which quantization times are used to determine whether events described in the baseline events file match corresponding events described in the replay events file.

The process of determining whether or not the baseline events file matches a replay events file involves determining whether the events in the replay events file match or correspond to the events in the baseline events file. Since the process may be applied at different stages of the design process, a direct comparison of value change timestamps and values may not be sufficient. As the module proceeds through the design process, the times of events may drift from the times of the corresponding events in the baseline events file. For example, additional simulated delays may occur in netlist style simulations as RTL statements are eventually mapped to logical primitives, which intrinsically have unit or back-annotated delays. The processes shown in FIGS. 5 and 7 show alternative approaches for matching events in the baseline events file to events in the replay events file. FIGS. 4 and 6 are timing diagrams of event scenarios that illustrate how the different approaches operate.

FIG. 6 is a timing diagram that shows how quantization times are used to determine whether events described in the baseline events file match corresponding events described in the replay events file. Events are snapped back to the beginning of the quantized time interval in which the events occur.

Corresponding events in the example have similar labels, with each event from the baseline events file having a label with a subscript b, and each event from the replay events file having a subscript r. The quantization times, which define constant intervals, are labeled $\Delta_0$, $\Delta_1$, $\Delta_2$, $\Delta_3$, and $\Delta_4$. In the example, event $e1_b$ and $e1_r$ are snapped back to time $\Delta_0$, and events $e2_b$ and $e2_r$ are snapped back to time $\Delta_1$. Events $e3_b$ and $e3_r$ are snapped to different times, $\Delta_2$. and $\Delta_3$, respectively. Since $e1_b$ and $e1_r$ are snapped back to the same time, and events $e2_b$ and $e2_r$ are snapped back to the same time, event $e1_b$ matches event $e1_r$, and event $e2_b$ matches event $e2_r$. Event $e3_b$ does not match event $e3_r$ since they snapped back to different times. In order for the replay events file to match the baseline events file, the timing of all the events in the baseline events file must match the timing of the corresponding events in the replay events file.

FIG. 7 is a flowchart of a process in which quantization times are used to determine whether events described in the baseline events file match corresponding events described in the replay events file. As the baseline events file and the replay events file are processed, the timestamped events are realigned to the beginning of the quantized time interval in which the events occur. This allows the timestamp and events to be directly compared because the baseline event and the replay event should snap back to the same time.

At block 502, event data for an event is obtained from the baseline events file, and at block 504, event data for a corresponding event (e.g., same value-identifier pair) is obtained from the replay events file. The quantization times for the events are determined at block 506. As shown in FIG. 4, the quantization time is the beginning ($\Delta_t$) of the time interval in which the event occurs.

If the quantization times are different or the signal values as indicated by the event data do not match, decision block 508 directs the process to block 510 where data is output to indicate the occurrence of an error in the simulation. Such data may indicate the signal identifiers, signal values, and different quantization times. If the quantization times and the signal values of the baseline event data and the replay event data match, the process is directed to decision block 512 to determine whether or not there is more event data to be processed in the baseline events file. If there is more event data, the process returns to block 502 to get unprocessed event data from the baseline events file. Otherwise, data is output at block 514 indicating that the module simulated correctly.

The snapback approach may not be suitable for all design scenarios. For example, if the ports on the module are clocked asynchronously, or clocked synchronously but not at integer multiples of one another, it is not possible to find a single A value with which to quantize the events. Eventually, a false miscompare will result once the timing of events drifts so that the events occur on either side of a quantization time. However, it should be appreciated that many different cores may be simulated purely synchronously or with clock signals that are integer multiples of one another. Also, the quantization time may be configured according to the anticipated amount of the drift in signal timestamps in simulations in subsequent stages of the design flow relative to the initial simulation.

Figure 8:
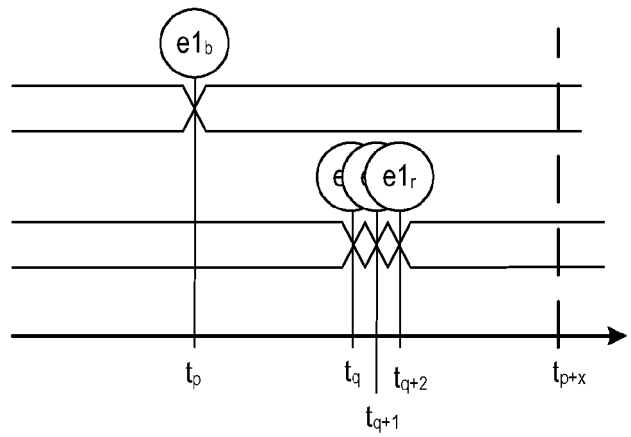
FIG. 8 is a timing diagram that shows how a window of time is used to determine whether events described in the baseline events file match corresponding events described in the replay events file.

As an alternative to use of a quantization time, FIGS. 6 and 7 show an approach in which the comparison process uses a search window to look for matching event data. FIG. 8 is a timing diagram that shows how a window of time is used to determine whether events described in the baseline events file match corresponding events described in the replay events file. For each event described in the baseline events file, a search window is defined ahead of that event, and a corresponding event is expected to have occurred within that search window. FIG. 6 shows event $e1_b$ as having occurred at time $t_p$, and corresponding event $e1_r$ as having taken on three different signal states at times $t_q$, $t_{q+1}$, and $t_{q+2}$. The matching process uses a search window that ranges from the time of an event described in the baseline events file, time $t_p$, to time $t_{p+x}$.

The event data for the latest occurring corresponding event ($e1_r$ at $t_{q+2}$) in this window is used to compare to the event data for event $e1_b$.

The width of the search window (i.e., x) may be selected based on the maximum number of logic levels in the core and the anticipated assignment delay properties of the target hardware. Also, the worst case path may be used in determining the size of the window. As the approach is applied in successive phases of the implementation flow, it is possible to recover more precise information about logic levels from the implementation tools and further tune the width of the search window to reduce the possibility of miscomparisons.

Figure 9:
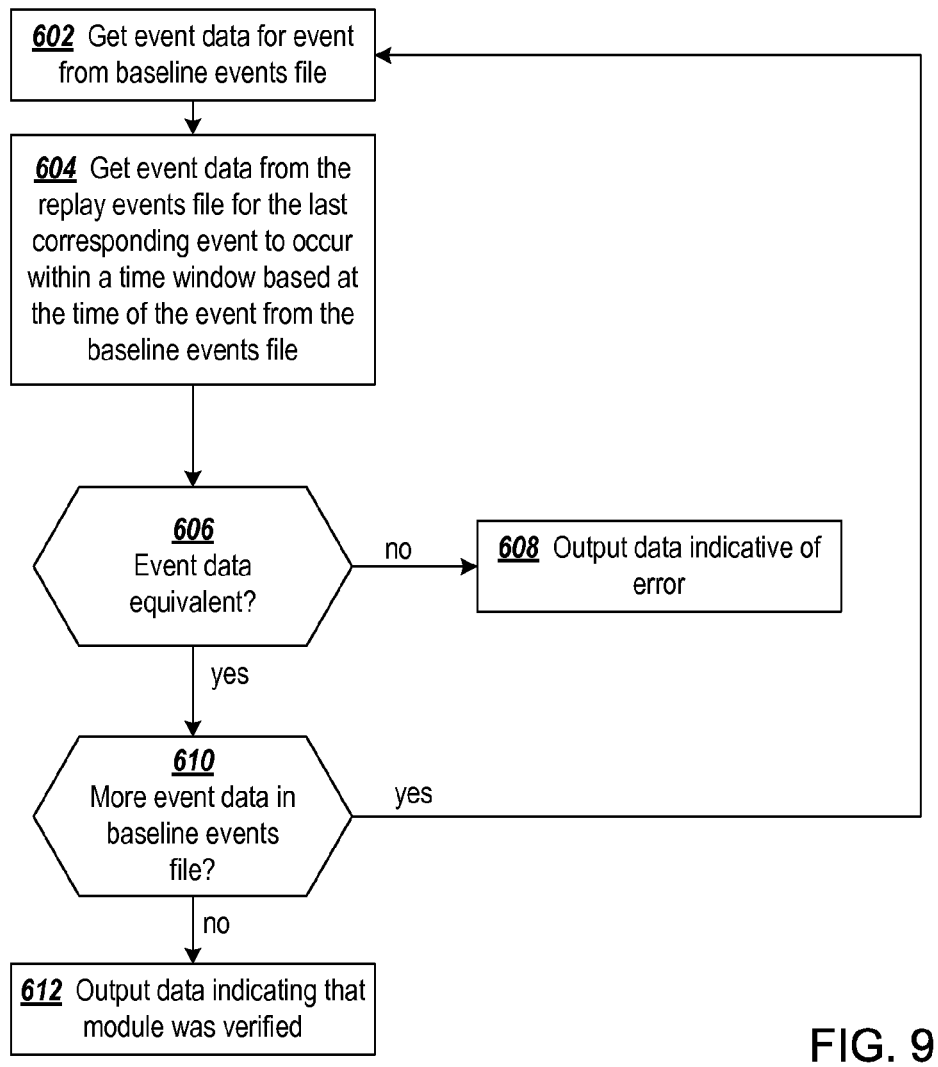
FIG. 9 is a flowchart of a process in which a window of time is used to determine whether events described in the baseline events file match corresponding events described in the replay events file.

FIG. 9 is a flowchart of a process in which a window of time is used to determine whether events described in the baseline events file match corresponding events described in the replay events file. At block 602, the data that describes an event in the baseline events file is obtained. At block 604, the process retrieves event data for the corresponding event described in the replay events file. The event data retrieved from the replay events file is for the event that corresponds to the event data retrieved from the baseline events file and that is the latest occurring corresponding event within the search window that begins at the time of the event from the baseline events file.

Decision block 606 determines whether or not the event data retrieved from the baseline events file is equivalent to the event data retrieved from the replay events file. If not, decision block 606 directs the process to block 608 where data is output to indicate the occurrence of an error in the simulation. Such data may indicate the signal identifiers and signal values. If the event data matches, the process is directed to decision block 610 to determine whether or not there is more event data to be processed in the baseline events file. If there is more event data, the process returns to block 602 to get unprocessed event data from the baseline events file. Otherwise, data is output at block 612 indicating that the module simulated correctly.

Figure 10:
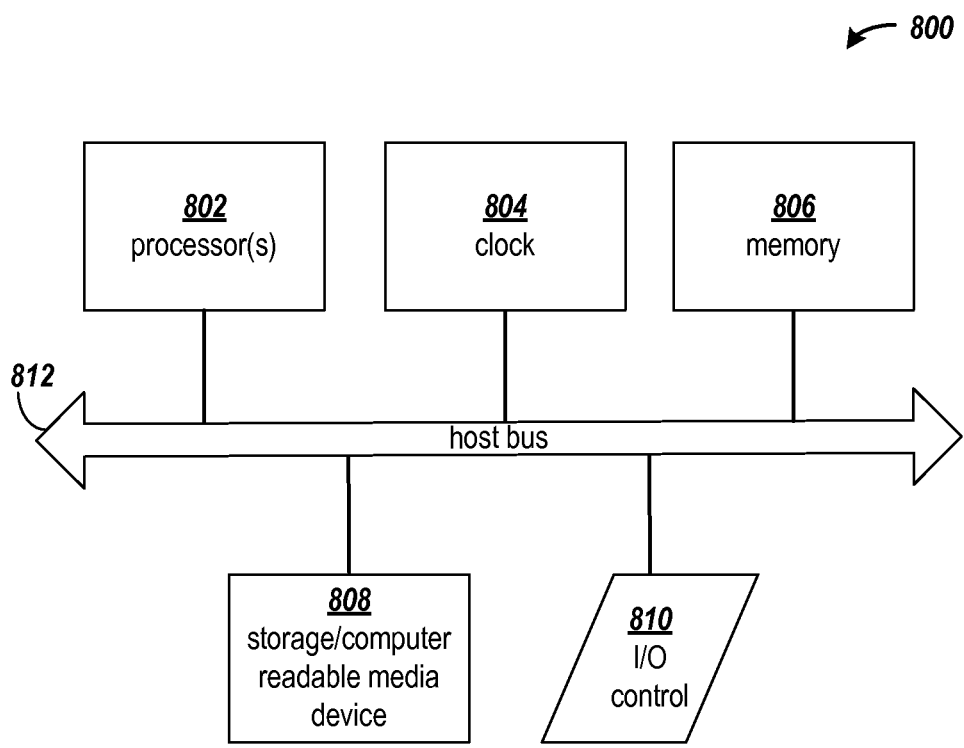
FIG. 10 shows a block diagram of an example computing arrangement that may be configured to implement the data structures and perform the operations of the processes described herein.

FIG. 10 shows a block diagram of an example computing arrangement that may be configured to implement the data structures and perform the operations of the processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory arrangement 806, a storage arrangement 808, and an input/output control unit 810, all coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory arrangement 806 and storage arrangement 808 may be combined in a single arrangement.

The processor(s) 802 executes the software in storage arrangement 808 and/or memory arrangement 806, reads data from and stores data to the storage arrangement 808 and/or memory arrangement 806, and communicates with external devices through the input/output control arrangement 810. These functions are synchronized by the clock signal generator 804. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and systems described herein are thought to be applicable to a variety of systems for simulation of a circuit design. Other aspects and features will be apparent to those skilled in the art from consideration of the specification. It is intended that the specification and drawings be considered as examples only, with a true scope of the invention being indicated by the following claims.

What is claimed is:

1. A method of testing a module of a circuit design, comprising:
   tagging a plurality of flip-flops in a netlist of the module with respective path names of the flip-flops from a hardware description language (HDL) specification of the module;
   simulating with the netlist on a programmed processor;
   capturing event data to a first file during the simulating, for each event the event data describing a signal identifier, an associated signal value, and an associated timestamp;
   determining whether or not event data in the first file matches event data in a second file of event data;
   in response to a difference determined between the first file and the second file, determining an earliest occurrence of an event in the first file having an associated signal value of a first signal that does not match an associated signal value of a corresponding event in the second file;
   determining one of the plurality of flip-flops that output the first signal; and
   outputting the respective path name of the one flip-flop.

2. The method of claim 1, further comprising:
   simulating with the HDL specification of the module; and
   capturing event data from the simulating with the HDL specification to the second file.

3. The method of claim 1, further comprising:
   tagging a first flip-flop of the plurality of flip-flops with respective path names of two or more flip-flops specified in the HDL specification, wherein the two or more flip-flops are combined into the first flip-flop in the netlist;
   wherein the outputting of the respective path name includes outputting the respective path names of the two or more flip-flops in response to the one flip-flop being the first flip-flop.

4. The method of claim 1, further comprising:
   tagging a non-flip-flop element in the netlist with a path name of a flip-flop from the HDL specification; and
   in response to a difference between a signal value in the first file and corresponding to output from the non-flip-flop element and a signal value in the second file and corresponding to output from the non-flip-flop element, outputting the path name of the non-flip-flop element.

5. The method of claim 1, further comprising:
simulating with the HDL specification of the module a first time using a testbench on a programmed processor;
capturing event data to the second file;
transforming data of the second file into an HDL replay module; and
synthesizing the module into the netlist after the transforming of the data of the second file into the HDL replay module;
wherein the simulating with the netlist includes simulating using the replay module.

6. The method of claim 5, wherein the determining whether or not event data in the first file matches event data in the second file includes:
determining respective quantization times for events indicated in the first file and events indicated in the second file; and
determining whether for each event indicated in the second file, a corresponding event indicated in the first file has a same quantization time.

7. The method of claim 5, wherein the determining whether or not event data in the first file matches event data in the second file includes, for each event described in the second file:
defining a window of time that commences with a time indicated by the timestamp associated with the event described in the second file; and
determining whether or not an event described in the first file, having an associated signal identifier equivalent to the signal identifier associated with the event described in the second file, and having an associated timestamp that is within the window of time and that is later than the timestamp associated with any other event having an associated signal identifier equivalent to the signal identifier associated with the event described in the second file, has an associated signal value equal to the signal value associated with the event described in the second file.

8. The method of claim 1, further comprising:
simulating with the HDL specification of the module a first time using a testbench on a programmed processor;
capturing event data to the second file;
transforming the data of the second file into an HDL replay module;
synthesizing the module into the netlist after the transforming of the data of the second file into the HDL replay module;
optimizing the netlist into an optimized module; and
wherein the simulating with the netlist includes simulating with the optimized module using the HDL replay module.

9. The method of claim 1, further comprising:
simulating with the HDL specification of the module a first time using a testbench on a programmed processor;
capturing event data to the second file;
transforming the data of the second file into an HDL replay module;
synthesizing the module into the netlist after the transforming of the data of the second file into the HDL replay module;
optimizing the netlist into an optimized module; and
placing the optimized module, resulting in a placed module;
wherein the simulating the netlist includes simulating with the placed module using the HDL replay module.

10. The method of claim 1, further comprising:
simulating with the HDL specification of the module a first time using a testbench on a programmed processor;
capturing event data to the second file;
transforming the data of the second file into an HDL replay module;
synthesizing the module into the netlist after the transforming of the data of the second file into the HDL replay module;
optimizing the netlist into an optimized module;
placing the optimized module, resulting in a placed module; and
routing the placed module, resulting in a routed module;
wherein the simulating with the netlist includes simulating with the routed module using the HDL replay module.

11. The method of claim 1, further comprising:
simulating with the HDL specification of the module a first time using a testbench on a programmed processor;
capturing event data to the second file;
transforming the data of the second file into an HDL replay module;
synthesizing the module into the netlist after the transforming of the data of the second file into the HDL replay module, wherein the simulating with the netlist includes simulating using the HDL replay module;
transforming one of the HDL specification or the netlist into a modified module;
simulating with the modified module;
capturing event data from the simulating with the modified design into a third file;
determining whether or not event data in the third file matches event data in the second file;
in response to a difference determined between the third file and the second file, determining an earliest occurrence of an event in the third file having an associated signal value of a third signal that does not match an associated signal value of a corresponding event in the second file;
determining a second one of the plurality of flip-flops that output the third signal; and
outputting the respective path name of the second flip-flop.

12. A system for testing a module of a circuit design, comprising:
a processor; and
a memory arrangement coupled to the processor and configured with program code, the program code when executed by the processor causing the processor to perform operations including:
tagging a plurality of flip-flops in a netlist of the module with respective path names of the flip-flops from a hardware description language (HDL) specification of the module;
simulating with the netlist on a programmed processor;
capturing event data to a first file during the simulating, for each event the event data describing a signal identifier, an associated signal value, and an associated timestamp;
determining whether or not event data in the first file matches event data in a second file of event data;
in response to a difference determined between the first file and the second file, determining an earliest occurrence of an event in the first file having an associated signal value of a first signal that does not match an associated signal value of a corresponding event in the second file;
determining one of the plurality of flip-flops that output the first signal; and
outputting the respective path name of the one flip-flop.

13. The system of claim 12, the operations further including:
  simulating with the HDL specification of the module; and
  capturing event data from the simulating with the HDL specification to the second file.

14. The system of claim 12, the operations further including:
  tagging a first flip-flop of the plurality of flip-flops with respective path names of two or more flip-flops specified in the HDL specification, wherein the two or more flip-flops are combined into the first flip-flop in the netlist; and
  the outputting of the respective path name includes outputting the respective path names of the two or more flip-flops in response to the one flip-flop being the first flip-flop.

15. The system of claim 12, the operations further including:
  tagging a non-flip-flop element in the netlist with a path name of a flip-flop from the HDL specification; and
  in response to a difference between a signal value in the first file and corresponding to output from the non-flip-flop element and a signal value in the second file and corresponding to output from the non-flip-flop element, outputting the path name of the non-flip-flop element.

16. The system of claim 12, the operations further including:
  simulating with the HDL specification of the module a first time using a testbench on a programmed processor;
  capturing event data to the second file;
  transforming data of the second file into an HDL replay module; and
  synthesizing the module into the netlist after the transforming of the data of the second file into the HDL replay module;
  wherein the simulating with the netlist includes simulating using the HDL replay module.

17. The system of claim 16, wherein the determining whether or not event data in the first file matches event data in the second file includes:
  determining respective quantization times for events indicated in the first file and events indicated in the second file; and
  determining whether for each event indicated in the second file, a corresponding event indicated in the first file has a same quantization time.

18. The system of claim 16, wherein the determining whether or not event data in the first file matches event data in the second file includes, for each event described in the second file:
  defining a window of time that commences with a time indicated by the timestamp associated with the event described in the second file; and
  determining whether or not an event described in the first file, having an associated signal identifier equivalent to the signal identifier associated with the event described in the second file, and having an associated timestamp that is within the window of time and that is later than the timestamp associated with any other event having an associated signal identifier equivalent to the signal identifier associated with the event described in the second file, has an associated signal value equal to the signal value associated with the event described in the second file.

19. The system of claim 12, the operations further including:
  simulating with the HDL specification of the module a first time using a testbench on a programmed processor;
  capturing event data to the second file;
  transforming the data of the second file into an HDL replay module;
  synthesizing the module into the netlist after the transforming of the data of the second file into the HDL replay module, wherein the simulating with the netlist includes simulating using the HDL replay module;
  transforming one of the HDL specification or the netlist into a modified module;
  simulating with the modified module;
  capturing event data from the simulating with the modified design into a third file;
  determining whether or not event data in the third file matches event data in the second file;
  in response to a difference determined between the third file and the second file, determining an earliest occurrence of an event in the third file having an associated signal value of a third signal that does not match an associated signal value of a corresponding event in the second file;
  determining a second one of the plurality of flip-flops that output the third signal; and
  outputting the respective path name of the second flip-flop.

* * * * *